(12) United States Patent
Tan

(10) Patent No.: US 12,356,733 B2
(45) Date of Patent: Jul. 8, 2025

(54) AVALANCHE PHOTODIODE STRUCTURE

(71) Applicant: PHLUX TECHNOLOGY LIMITED, Sheffield (GB)

(72) Inventor: Chee Hing Tan, Sheffield (GB)

(73) Assignee: PHLUX TECHNOLOGY LIMITED (GB)

( * ) Notice: Subject to any disclaimer, the term of this patent is extended or adjusted under 35 U.S.C. 154(b) by 696 days.

(21) Appl. No.: 17/777,775

(22) PCT Filed: Nov. 18, 2020

(86) PCT No.: PCT/GB2020/052930
§ 371 (c)(1),
(2) Date: May 18, 2022

(87) PCT Pub. No.: WO2021/099769
PCT Pub. Date: May 27, 2021

(65) Prior Publication Data
US 2022/0416110 A1     Dec. 29, 2022

(30) Foreign Application Priority Data

Nov. 18, 2019  (GB) ..................................... 1916784
Oct. 2, 2020   (GB) ..................................... 2015674

(51) Int. Cl.
*H10F 30/225*   (2025.01)
*H10F 77/124*   (2025.01)
*H10F 77/14*    (2025.01)

(52) U.S. Cl.
CPC ..... *H10F 30/2255* (2025.01); *H10F 77/1248* (2025.01); *H10F 77/1468* (2025.01)

(58) Field of Classification Search
CPC .......................... H10F 30/2255; H10F 77/1248
See application file for complete search history.

(56) References Cited

U.S. PATENT DOCUMENTS

| 7,161,170 B1 | 1/2007 | Yoder |
| 2003/0111675 A1* | 6/2003 | Yao ..................... H10F 30/2255 257/233 |

(Continued)

FOREIGN PATENT DOCUMENTS

| CN | 104465853 A | 3/2015 |
| CN | 110047967 A | 7/2019 |

(Continued)

OTHER PUBLICATIONS

German Search Report for German Application No. GB1916784, dated Aug. 18, 2020, 4 pages.

(Continued)

*Primary Examiner* — Douglas M Menz
(74) *Attorney, Agent, or Firm* — Dickinson Wright PLLC

(57) ABSTRACT

An avalanche photodiode (APD) structure, comprising an absorption layer comprising InGaAs, InGaAlAs, InGaAsP, or an InGaAs/GaAsSb type-II superlattice, an avalanche layer comprising AlGaAsSb, and a transition portion disposed between the absorption layer and the avalanche layer is disclosed. The transition portion comprises a first grading layer of InAlGaAs or InGaAsP and a first field control layer disposed between the first grading layer and the avalanche layer. The first field control layer has a bandgap between the bandgap of the absorption layer and the bandgap of the avalanche layer. In an alternative embodiment, an avalanche photodiode (APD) structure, comprising an absorption layer comprising GaAsSb, an avalanche layer comprising AlGaAsSb, and a transition portion disposed between the absorption layer and the avalanche layer. The transition portion comprises a first grading layer and one or more field control layers having a bandgap between the bandgaps of the absorption layer and the avalanche layer.

27 Claims, 6 Drawing Sheets

(56) References Cited

U.S. PATENT DOCUMENTS

| | | | |
|---|---|---|---|
| 2007/0196113 A1 | 8/2007 | Fathimulla et al. |
| 2009/0315073 A1 | 12/2009 | Shi et al. |
| 2015/0179863 A1 | 6/2015 | Huffaker et al. |
| 2017/0244002 A1 | 8/2017 | Campbell et al. |

FOREIGN PATENT DOCUMENTS

| | | |
|---|---|---|
| JP | H0273676 A | 3/1990 |
| JP | 2012243907 A | 12/2012 |
| JP | 2016213362 A | 12/2016 |
| WO | 2011144938 A2 | 11/2011 |
| WO | 2019012276 A1 | 1/2019 |

OTHER PUBLICATIONS

International Search Report and Written Opinion for PCT Application No. PCT/GB2020/052930, mailed May 26, 2021, 21 pages.

Chee Hing Tan et al., "Low Noise Avalanche Photodiodes Incorporating a 40 nm AlAsSb Avalanche Region", IEEE Journal of Quantum Electronics, IEEE Service Center, Piscataway, NJ, USA, vol. 48, No. 1, Jan. 2012 (Jan. 2012), p. 1-6.

Lucas Laurent Gaston Pinel, "Thin AlGaAsSb avalanche photodiodes with low excess noise", Nov. 2018 (Nov. 2018), p. 1-121.

Jingjing Xie et al, "An InGaAs/AlAsSb Avalanche Photodiode With a Small Temperature Coefficient of Breakdown", IEEE Photonics Journal, IEEE, USA, vol. 5, No. 4, Jul. 11, 2013 (Jul. 11, 2013), p. 1-7.

Craig A P et al, "Extended short-wave infrared linear and Geiger mode avalanche photodiodes, based on 6.1 Å materials", Feb. 4, 2019 (Feb. 4, 2019), vol. 114, No. 5, p. 1-6.

Examination Report for European Application No. 20812403.2, dated Jun. 14, 2024, 9 pages.

Xie et al., "InGaAs/AlGaAsSb avalanche photodiode with high gain-bandwidth product," Research Article, Oct. 17, 2026, 6 pages, vol. 24, No. 21, Optics Express, United Kingdom.

Zhou et al., "InGaAs/AlGaAsSb APD with over 200 GHz gain-bandwidth product," Compound Semiconductor Week 2016, 2 pages, IEEE, United Kingdom.

\* cited by examiner

**FIGURE 1A
(PRIOR ART)**
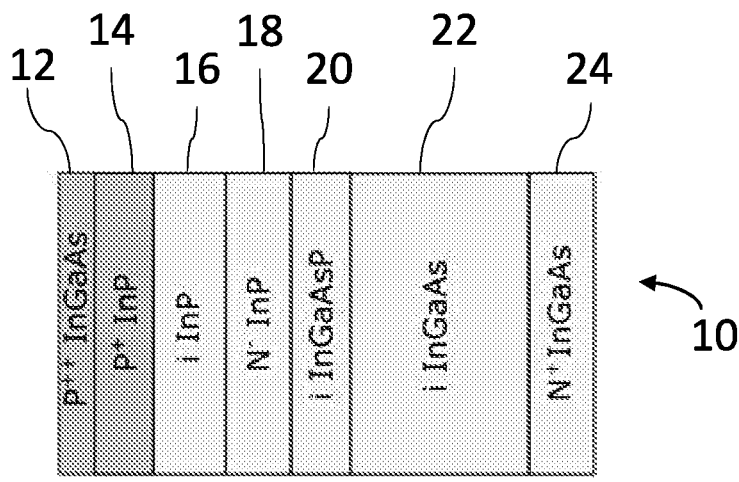
**FIGURE 1B
(PRIOR ART)**
**FIGURE 1C
(PRIOR ART)**
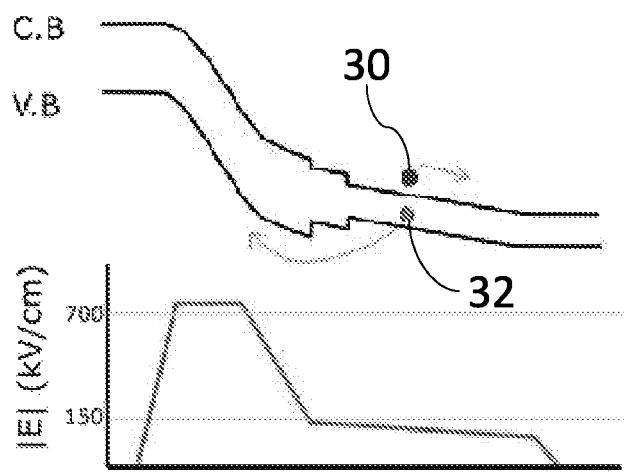
FIGURE 2
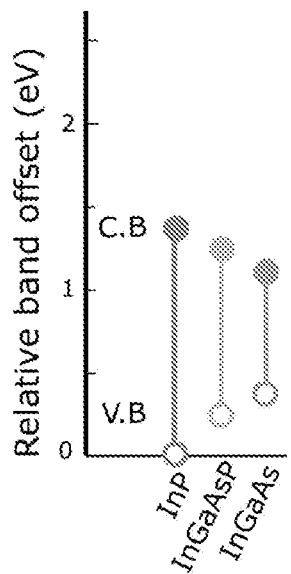

FIGURE 5A
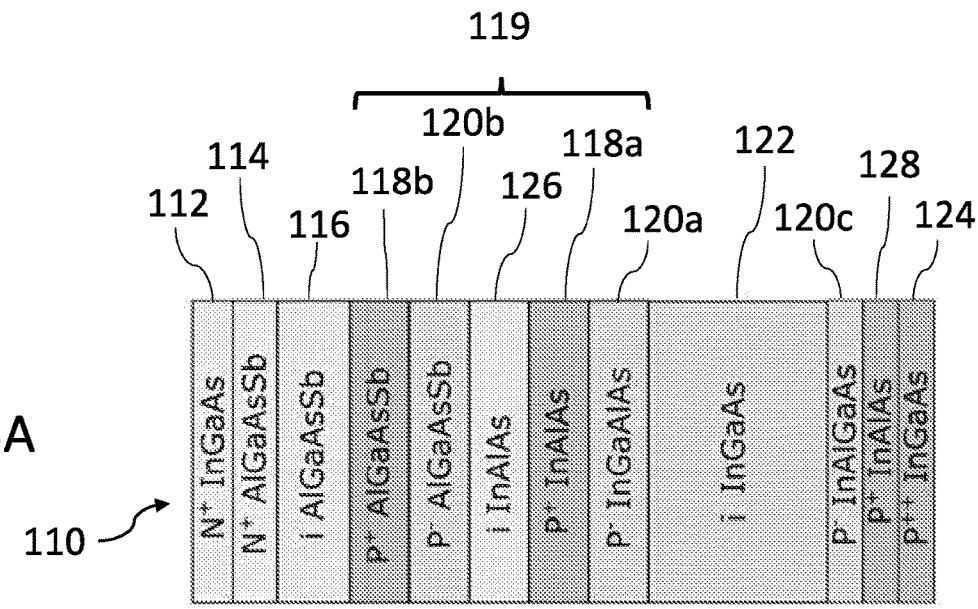
FIGURE 5B
FIGURE 5C
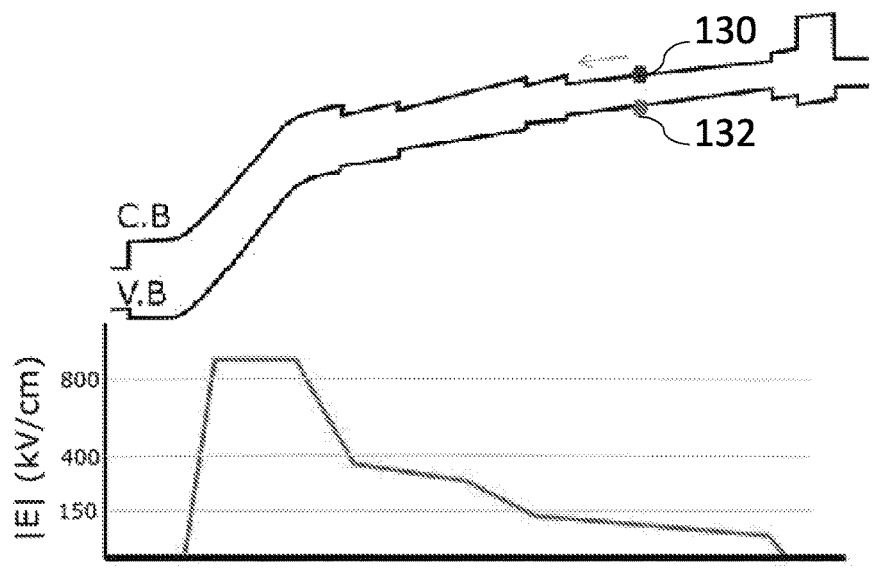

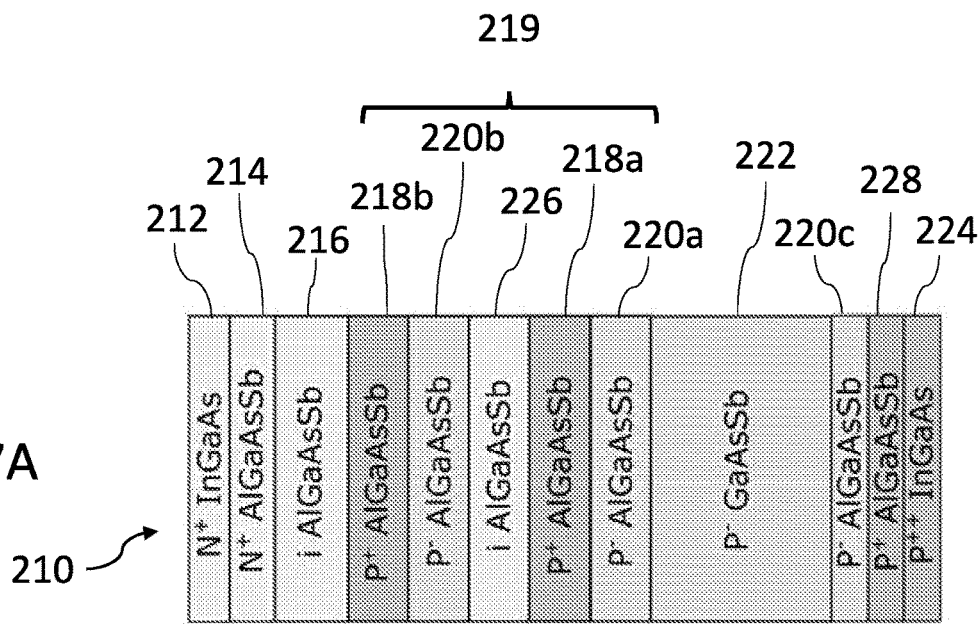
FIGURE 7A
FIGURE 7B
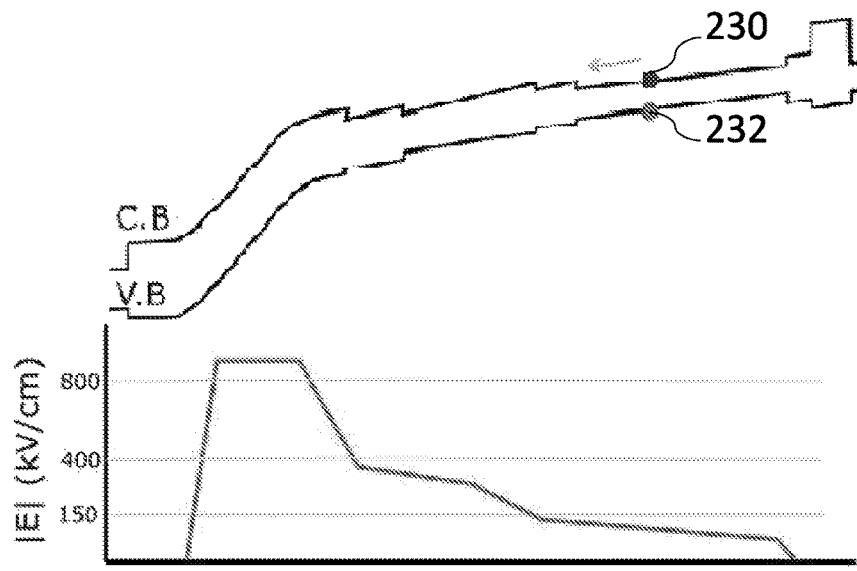
FIGURE 7C

AVALANCHE PHOTODIODE STRUCTURE

CROSS-REFERENCE TO RELATED APPLICATIONS

The present application is a U.S. national phase application of International Patent Application No. PCT/GB2020/052930, filed on Nov. 18, 2020, which claims priority to Great Britain Patent Application No. 1916784.0, filed on Nov. 18, 2019, and Great Britain Patent Application No. 2015674.1, filed on Oct. 2, 2020, the disclosures of which are hereby incorporated by reference in their entireties.

The present invention relates to an avalanche photodiode (APD) structure, and particularly to an improved separate absorption and multiplication (SAM)APD structure that contains Sb.

BACKGROUND

Avalanche photodiodes (APD) have internal gain and are used to improve the sensitivity of optical systems. Example applications include laser range finding; light detection and ranging (LIDAR) systems using time of flight and frequency modulated continuous wave measurements; optical time domain reflectometry; telecommunications and quantum communications and computing. The internal gain of an APD is generated through a process called impact ionisation, whereby charge carriers gain energy in a high electric field and multiply. InGaAs lattice matched to InP has a bandgap energy of 0.75 eV at room temperature and is used as the absorbing layer in a wide range of infrared detectors. However, InGaAs is not suitable for generating avalanche gain as its narrow bandgap generates excessive tunnelling current at the high electric fields required for impact ionisation. In order to minimize tunnelling currents, infrared APDs use an APD design called a separate absorption and multiplication (SAM)APD. In a SAMAPD a wider bandgap semiconductor such as InP is used for avalanche gain, and a separate InGaAs region is used to absorb light. The electric field in the InGaAs layer is kept low, typically below 200 kV/cm to avoid significant tunnelling current, while the electric field in the wider bandgap avalanche layer is much higher, typically above 500 kV/cm for a thin avalanche layer, to generate avalanche gain. A wide bandgap field control layer is inserted between the absorption and multiplication regions to achieve this high-low electric field profile as shown in FIG. 1C.

InGaAs and InP are direct bandgap semiconductors with respective bandgaps of 0.75 and 1.35 eV at room temperature, therefore providing a difference of 0.6 eV. This energy difference leads to offset energies in the conduction and valence band. Holes transferring from InGaAs to InP must overcome the valence band offset energy. To ensure efficient hole transfer from InGaAs and InP in an SAMAPD, a bandgap grading layer is used to gradually reduce the bandgap offset. This is typically achieved by inserting a layer with a bandgap in-between that of InGaAs and InP such as InGaAsP, as illustrated in FIG. 1A.

FIG. 1A schematically shows a known SAMAPD structure 10 having a first contact layer 12 comprising $P^{++}$ InGaAs and a second contact layer 24 comprising $N^+$ InGaAs. Either or both of the first and second contact layers 12, 24 may form the external layers of the structure 10. Adjacent to the first contact layer 12 is a cladding layer 14 comprising $P^+$ InP. Next, a multiplication layer 16 comprising intrinsic InP is provided. Adjacent to the second contact layer 24 is provided an absorption layer 22 comprising intrinsic InGaAs. Between the multiplication layer 16 and the absorption layer 22 are provided a field control layer 18 comprising $N^-$ InP and a bandgap grading layer 20 comprising intrinsic InGaAsP, where the field control layer 18 is adjacent to the multiplication layer 16 and the bandgap grading layer 20 is disposed between the field control layer 18 and the absorption layer 22.

The InGaAsP bandgap grading layer 20 acts as an energy stepping layer between the InGaAs absorption layer 22 and InP field control and multiplication layers 18, 16, and the low electric field across this region provides the carriers with sufficient energy to efficiently transfer therebetween. An example band structure of a typical InGaAs/InP SAMAPD (such as the one of FIG. 1A) is shown below in FIG. 1B, and the relative conduction band (C.B) and valence band (V.B) offsets of InGaAs, InGaAsP and InP in the gamma ($\Gamma$) valley are shown in FIG. 2. FIG. 1B schematically shows an electron 30 of a photo-generated electron-hole pair travelling from the absorption layer 22 to the contact layer 24 while a corresponding hole 32 of the photo-generated electron-hole pair is travelling from the absorption layer 22 to the multiplication layer 16.

Current infrared APDs using an InP (or InAlAs) multiplication layer generate a significant amount of electronic noise, called avalanche excess noise, during avalanche multiplication. This imposes a limit of the maximum gain that the APD can produce before the excess noise becomes unacceptably large.

It is an object of certain embodiments of the present invention to overcome certain disadvantages associated with the present invention.

BRIEF SUMMARY OF THE DISCLOSURE

In accordance with an aspect of the present invention there is provided an avalanche photodiode (APD) structure, comprising:
  an absorption layer comprising InGaAs, InGaAlAs, InGaAsP, or an InGaAs/GaAsSb type-II superlattice;
  an avalanche layer comprising AlGaAsSb; and
  a transition portion disposed between the absorption layer and the avalanche layer;
  wherein the transition portion comprises a first grading layer of InAlGaAs or InGaAsP and a first field control layer disposed between the first grading layer and the avalanche layer;
  wherein the first field control layer has a bandgap between the bandgap of the absorption layer and the bandgap of the avalanche layer.

Throughout the present specification including the claims, any semiconductor materials described may be lattice matched to InP in certain embodiments of the present invention.

The first field control layer may be p-doped, in particular, the first field control layer may be p-doped at a concentration between $1\times10^{17}$ cm$^{-3}$ and $1\times10^{18}$ cm$^{-3}$, and optionally between $1\times10^{17}$ cm$^{-3}$ and $5\times10^{17}$ cm$^{-3}$. In certain embodiments, the first field control layer may have a thickness between 40 nm and 300 nm The first grading layer may be graded so as to have an increasing bandgap along the direction from the absorption layer to the avalanche layer. The bandgap of the first grading layer may increase from that of the absorption layer to that of InAlAs. In certain embodiments, the first grading layer may comprise discrete layers of differing bandgaps or a layer having a continuously increasing bandgap.

The APD structure may comprise a second grading layer of AlGaAsSb disposed between the first field control layer and the avalanche layer. A double field control structure is necessary when the electric field in the avalanche layer is required to be above 600 kV/cm. The bandgap of the second grading layer may increase to that of the avalanche layer. The bandgap of the second grading layer may increase from that of InAlAs to that of the avalanche layer. The APD structure may comprise a second field control layer disposed between the second grading layer and the avalanche layer. In certain embodiments, the second field control layer may comprise AlGaAsSb. The second field control layer may be p-doped.

In certain embodiments, the avalanche layer may comprise $Al_xGa_{1-x}As_ySb_{1-y}$, where x is between 0.4 and 1.0 inclusive and optionally between 0.85 and 1.0 inclusive. In certain embodiments, y may be chosen to lattice match the alloy (i.e. $Al_xGa_{1-x}As_ySb_{1-y}$) to InP. In certain embodiments, y may be 0.56 when x is 0.85 to ensure lattice matching to InP (e.g. $Al_{0.85}Ga_{0.15}As_{0.56}Sb_{0.44}$).

In certain embodiments, the absorption layer may have a thickness between 100 and 3000 nm, optionally between 500 and 1500 nm, and further optionally between 1000 and 1500 nm.

In certain embodiments, the avalanche layer may have a thickness between 50 and 2000 nm, and optionally between 50 and 1500 nm.

In certain embodiments, the first field control layer may comprise a material that is lattice-matched to InP. In certain embodiments, the first field control layer may comprise InAlAs or InP. In certain embodiments, the first field control layer may have a bandgap of 1 eV or greater.

In accordance with another aspect of the present invention there is provided an avalanche photodiode (APD) structure, comprising:
 an absorption layer comprising GaAsSb;
 an avalanche layer comprising AlGaAsSb; and
 a transition portion disposed between the absorption layer and the avalanche layer;
 wherein the transition portion comprises a first grading layer and one or more field control layers disposed between the absorption layer and the avalanche layer, wherein the first grading layer comprises $Al_xGa_{1-x}AsSb$ that is graded so that x increases from x=0 to x>0 along a direction from the absorption layer to the avalanche layer, and the one or more field control layers has a bandgap between the bandgap of the absorption layer and the bandgap of the avalanche layer.

As stated above, throughout the present specification including the claims, any semiconductor materials described may be lattice matched to InP in certain embodiments of the present invention.

In certain embodiments, the avalanche layer may comprise $Al_xGa_{1-x}As_ySb_{1-y}$, where x is between 0.4 and 1.0 inclusive and optionally between 0.85 and 1.0 inclusive. In certain embodiments, y may be chosen to lattice match the alloy (i.e. $Al_xGa_{1-x}As_ySb_{1-y}$) to InP. In certain embodiments, y may be 0.56 when x is 0.85 to ensure lattice matching to InP (e.g. $Al_{0.85}Ga_{0.15}As_{0.56}Sb_{0.44}$).

The first grading layer may comprise $Al_xGa_{1-x}As_ySb_{1-y}$ that is graded so that x increases from 0 to between 0.4 and 1.0 inclusive, and optionally to between 0.85 and 1 inclusive. In certain embodiments, y may be chosen to lattice match the alloy (i.e. $Al_xGa_{1-x}As_ySb_{1-y}$) to InP. In certain embodiments, y may be 0.56 when x is 0.85 to ensure lattice matching to InP (e.g. $Al_{0.85}Ga_{0.15}As_{0.56}Sb_{0.44}$). The first grading layer may comprise discrete layers of differing bandgaps or a layer having a continuously increasing bandgap.

In certain embodiments, the absorption layer may have a thickness between 500 and 1500 nm, and optionally between 1000 and 1500 nm.

In certain embodiments, the avalanche layer may have a thickness between 50 and 2000 nm, and optionally between 50 and 1500 nm.

The one or more field control layers may comprise one or more layers of AlGaAsSb, which may be p-doped.

BRIEF DESCRIPTION OF THE DRAWINGS

Embodiments of the invention are further described hereinafter with reference to the accompanying drawings, in which:

FIG. 1A (PRIOR ART) is a schematic diagram of a typical InGaAs/InP SAMAPD;

FIG. 1B (PRIOR ART) is a band diagram of a known reverse bias SAMAPD, such as the one of FIG. 1A;

FIG. 1C (PRIOR ART) shows the modulus of the electric field within a known SAMAPD, such as the one of FIG. 1A;

FIG. 2 shows the relative band offset between InP, InGaAsP and InGaAs in the Γ valley;

FIG. 5A is a schematic diagram of a InGaAs/InAlAs/AlGaAsSb SAMAPD in accordance with an embodiment of the present invention;

FIG. 5B is a band diagram of the reverse bias InGaAs/InAlAs/AlGaAsSb SAMAPD of FIG. 5A;

FIG. 5C shows the modulus of the electric field within the InGaAs/InAlAs/AlGaAsSb SAMAPD of FIG. 5A;

FIG. 7A is a schematic diagram of a GaAsSb/AlGaAsSb SAMAPD in accordance with an embodiment of the present invention;

FIG. 7B is a band diagram of the reverse bias GaAsSb/AlGaAsSb SAMAPD of FIG. 7A; and FIG. 7C shows the modulus of the electric field within the GaAsSb/AlGaAsSb SAMAPD of FIG. 7A.

DETAILED DESCRIPTION

Throughout the present specification, the terms avalanche and multiplication are used interchangeably (for example, "avalanche layer" is synonymous with "multiplication layer").

A newly identified material, $Al_xGa_{1-x}As_ySb_{1-y}$, has near ideal avalanche multiplication characteristics yielding very low noise APDs. However, combining a narrow bandgap InGaAs absorption layer with a wide bandgap $Al_xGa_{1-x}As_ySb_{1-y}$ to construct a SAMAPD is challenging, particularly if the chosen $Al_xGa_{1-x}As_ySb_{1-y}$ alloy has a bandgap that is larger than InP or InAlAs. Example compositions of interest are alloys with x=0.4 to 1.0, and optionally 0.85 to 1.0. Y may be chosen to lattice match the alloy to InP. For example, y may be 0.56 when x is 0.85 to ensure lattice matching to InP (e.g. $Al_{0.85}Ga_{0.15}As_{0.56}Sb_{0.44}$)

Figure 3:
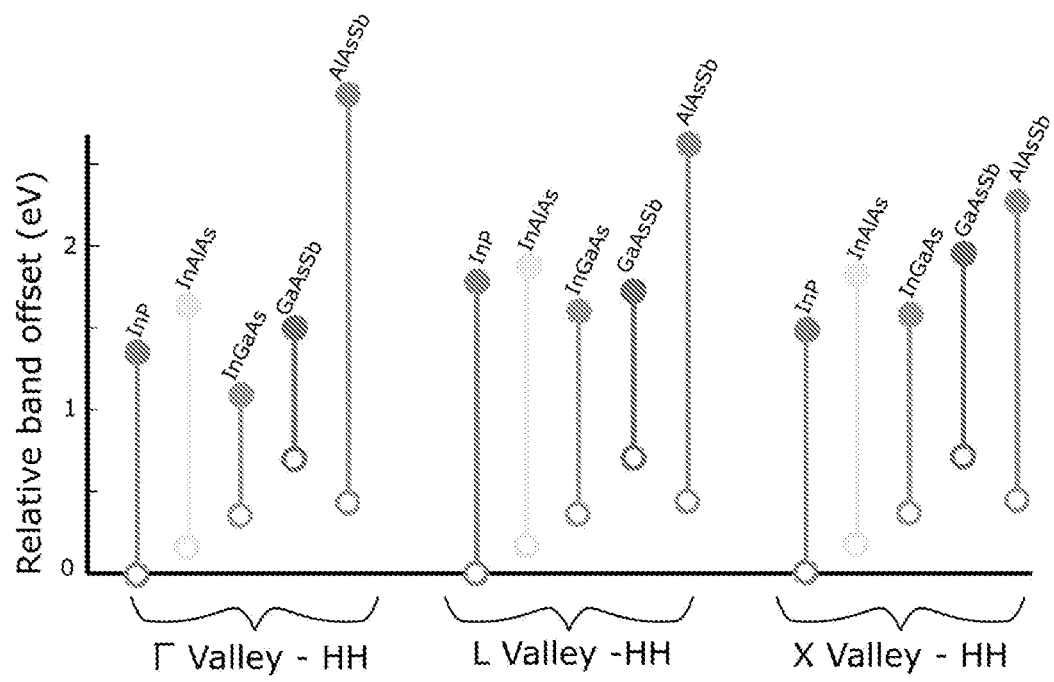
FIG. 3 shows the relative band offset of InAlAs, InGaAs, GaAsSb and AlAsSb lattice matched to InP at the bottom of the Γ, L and X valleys and top of the heavy hole band.

The relative band offset between various semiconductors lattice matched to InP are shown in FIG. 3. The band structures and band-offsets for the binary and ternary compounds shown in FIG. 3 are well established and are used as the basis for embodiments of the present invention. For zero Ga composition, AlAsSb is an indirect bandgap semiconductor where the conduction band minimum is in the X valley at 1.65 eV. The bandgap of AlAsSb in the Γ and L valley is very large at 2.5 eV and 2.2 eV, respectively. All other semiconductors listed in FIG. 3 have a direct bandgap in the Γ valley. This creates a problem when transferring charge (particularly from an InGaAs absorption layer) into AlAsSb (or AlGaAsSb). In contrast to AlAsSb, GaAsSb is a direct bandgap semiconductor. Similarly $Al_xGaAsSb$ is also a direct bandgap semiconductor when x is small, but for large values of x, $Al_xGaAsSb$ is an indirect semiconductor.

Under low electric fields (<200 kV/cm), electrons in InGaAs and InAlAs predominantly populate the Γ or L valley, the transport of electrons from InGaAs and InAlAs to AlAsSb is poor. For example, electrons at the minimum of the Γ or L valley in InGaAs require an additional 1.75 and 0.9 eV respectively to enter AlAsSb, as shown in FIG. 3. Electrons in the X valley of InGaAs have a significantly lower barrier to enter AlAsSb of 0.69 eV. However, electrons do not significantly populate the X valley of InGaAs or InAlAs below an electric field of approximately 300 kV/cm.

While using a typical SAMAPD structure, such as the one shown in FIG. 1A, creating an electric field of 300 kV/cm in the bandgap grading layer and the absorption layer would induce excessive tunneling currents from the InGaAs absorption layer 22 of the SAMAPD.

In accordance with embodiments of the present invention, therefore, the SAMAPD structure is configured such that, under operation, most electrons (or, in some cases, holes) populate the bandstructure zone with minimal band offset. Structures according to certain embodiments of the present invention may be used in either a n-i-p configuration, in which a p-type contact layer is grown on a substrate, or a p-i-n configuration, in which a n-type contact layer is grown on a substrate.

Figure 4A:
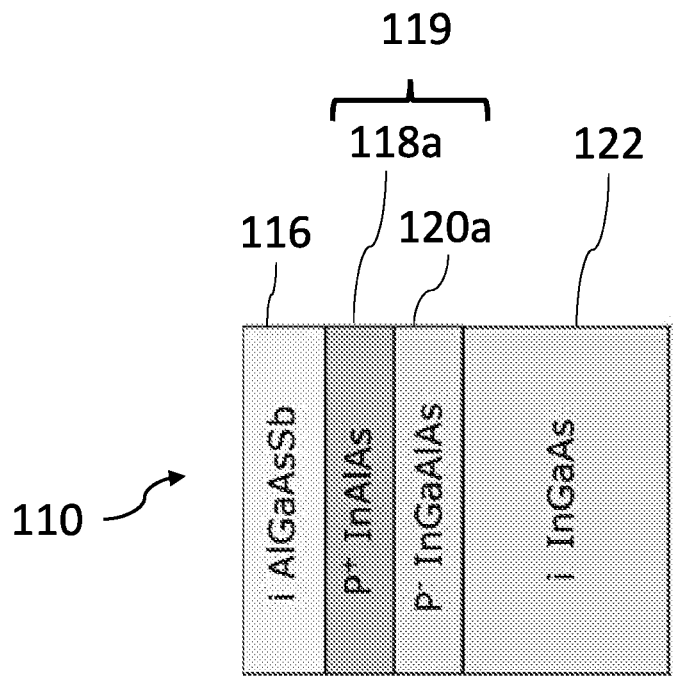
FIG. 4A is a schematic diagram of a InGaAs/InAlAs/AlGaAsSb SAMAPD in accordance with an embodiment of the present invention.
Figure 4B:
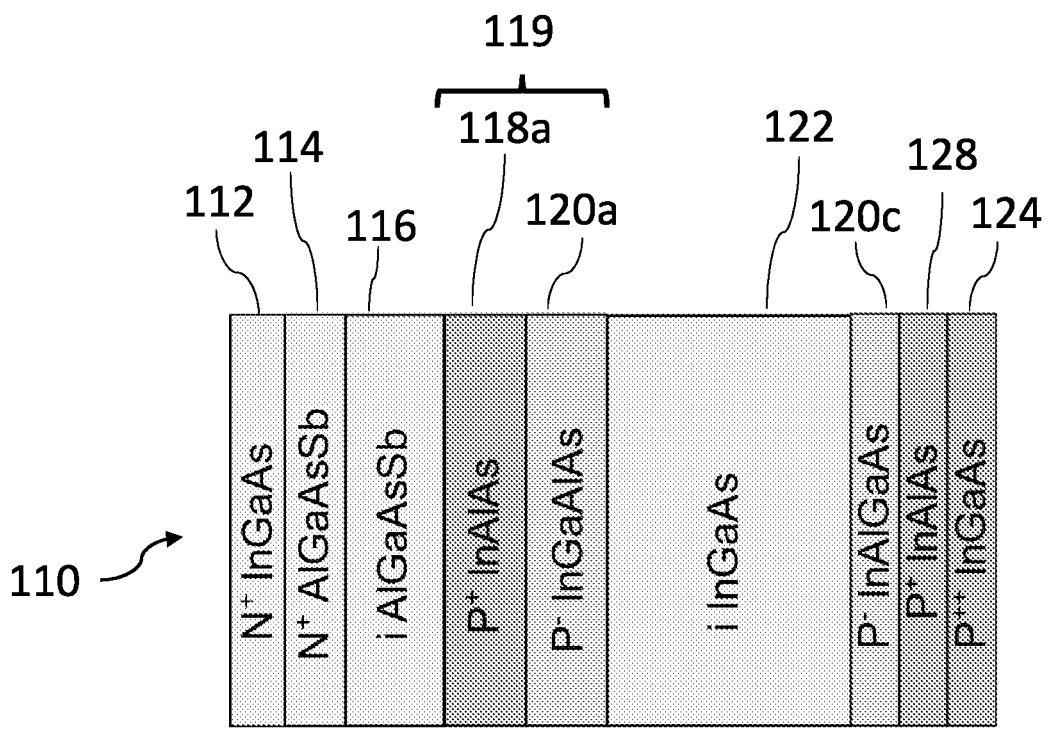
FIG. 4B is a schematic diagram of a InGaAs/InAlAs/AlGaAsSb SAMAPD in accordance with an embodiment of the present invention.

In one embodiment of the present invention, shown schematically in FIG. 4A, there is provided a SAMAPD structure 110 having an absorption layer 122 comprising InGaAs and a AlGaAsSb avalanche layer 116. In alternative embodiments, the absorption layer 122 may comprise InGaAlAs, InGaAsP, or an InGaAs/GaAsSb type-II superlattice. A transition portion 119 is disposed between the absorption layer 122 and the avalanche layer 116. The transition portion 119 comprises a first grading layer 120a of InAlGaAs and a first field control layer 118a disposed between the first grading layer 120a and the avalanche layer 116. In alternative embodiments, the first grading layer 120a may comprise InGaAsP. The first field control layer 118a has a bandgap between the bandgap of the absorption layer 122 and the bandgap of the avalanche layer 116. FIG. 4B shows a structure 110 that corresponds to that of FIG. 4A that additionally includes a first contact layer 112 and a cladding layer 114 adjacent to the avalanche layer 116, and a second contact layer 124 on an opposing side to the first contact layer 112. The first contact layer 112 may comprise heavily doped $N^+$ InGaAs. The first contact layer 112 may have a thickness between 10 and 1000 nm. The second contact layer 124 may comprise heavily doped $P^{++}$ InGaAs and/or may have a thickness of between 50 and 100 nm. Between the second contact layer 124 and the absorption layer 122, there is provided a barrier layer 128 adjacent the second contact layer 124 and a third grading layer 120c disposed between the barrier layer 128 and the absorption layer 122. The barrier layer 128 may comprise highly doped $P^+$ InAlAs and/or may have a thickness between 100 and 300 nm. The third grading layer 120c may comprise InAlGaAs and may be graded as described above in relation to the first and/or second grading layers 120a, 120b. The third grading layer 120c may comprise very lightly p-doped InAlGaAs with step or continuous bandgap grading between InGaAs and InAlAs. The third grading layer 120c may comprise 2 to 3 layers of 20 to 50 nm thickness (if stepped) or a single layer having a thickness of about 100 nm (if continuously graded).

The effect of the first field control layer 118a is that the electric field profile of the SAMAPD structure 110 is altered such that the electrons predominantly populate the X valleys.

The first field control layer 118a is made of a wider bandgap material relative to the absorption layer 122, and is used to increase the electric field to a suitable value to ensure that electrons are predominantly in X valleys, whilst minimizing tunnelling current. Tunnelling current minimization requires InGaAs to be at an electric field that is below 200 kV/cm but band alignments require the field in InGaAs to be higher, presenting an incompatibility. This incompatibility is addressed by the presence of the first field control layer 118a.

In certain embodiments, the first field control layer 118a is p-doped. In certain embodiments, the first field control layer 118a is p-doped at a concentration between $1\times10^{17}$ $cm^{-3}$ and $1\times10^{18}$ $cm^{-3}$, and optionally between $1\times10^{17}$ $cm^{-3}$ and $5\times10^{17}$ $cm^{-3}$. In certain embodiments, the first field control layer 118a has a thickness between 40 nm and 300 nm. In certain embodiments, the first field control 118a layer comprises InAlAs or InP. In certain embodiments, the first field control 118a has a bandgap of 1 eV or greater.

In certain embodiments, the first grading layer 120a may have a constant bandgap across its thickness. In alternative embodiments, the first grading layer 120a may be graded so as to have an increasing bandgap along the direction from the absorption layer 122 to the avalanche layer 116. In certain embodiments, the grading of the first grading layer 120a may be continuous (e.g. across a thickness of 100 nm) or stepped. For example, a stepped grading may be achieved by a plurality of layers, where each layer has a different bandgap relative to adjacent layers. In certain embodiments, 2 or 3 "step" layers may be provided, where, optionally, each layer may have a thickness of 20 to 50 nm.

In certain embodiments, the bandgap of the first grading layer 120a increases from that of the absorption layer 122 to that of InAlAs or InP.

In non-limiting embodiments, the absorption layer 122 comprises intrinsic InGaAs, the first grading layer 120a comprises $P^-$ InGaAlAs, the first field control layer 118a comprises $P^+$ InAlAs, and the avalanche layer 116 comprises intrinsic AlGaAsSb. The absorption layer 122 may be intrinsic and/or, in some embodiments may have a thickness between 1000 and 1500 nm. The first grading layer 120a may be very lightly p-doped. The first field control layer 118a may be p-doped to allow the electric field in the InAlAs to reach up to 600 kV/cm. The first field control layer 118a may have a thickness between 50 and 100 nm. The avalanche layer 116 may be of between 50 and 1500 nm. In certain embodiments, the avalanche layer 116 may comprise $Al_xGa_{1-x}As_ySb_{1-y}$, where x is between 0.4 and 1.0 inclusive and optionally between 0.85 and 1.0 inclusive. In certain embodiments, y may be chosen to lattice match the alloy to InP. In certain embodiments, y may be 0.56 when x is 0.85 to ensure lattice matching to InP (e.g. $Al_{0.85}Ga_{0.15}As_{0.56}Sb_{0.44}$).

In the specific, non-limiting embodiment shown in FIG. 5A, there is also provided an intrinsic layer 126 adjacent to the first field control layer 118a, a second grading layer 120b adjacent to the intrinsic layer 126, and a second field control layer 118b adjacent to and in between the second grading layer 120b and the avalanche layer 116.

FIG. 5B shows an energy band diagram corresponding to the structure 110 of FIG. 5A (with an electron 130 and a hole 132 of a photo-generated electron-hole pair shown for completeness). FIG. 5C shows the modulus of the electric field within the structure of FIG. 5A.

The intrinsic layer 126 may comprise intrinsic InAlAs and may allow an electric field up to 600 kV/cm. The intrinsic layer 126 may have a thickness between 50 and 200 nm.

The second grading layer 120b may comprise P⁻ AlGaAsSb. The second grading layer 120b may be graded in the same manner as described above in relation to the first grading layer 120a. The second grading layer 120b may be graded using AlGaAsSb with a bandgap similar to InAlAs and that increases to the bandgap of $Al_xGa_{1-x}As_ySb_{1-y}$, where x is between 0.4 and 1.0 inclusive, and optionally to between 0.85 and 1 inclusive. In certain embodiments, y may be chosen to lattice match the alloy to InP. In certain embodiments, y may be 0.56 when x is 0.85 to ensure lattice matching to InP (e.g. $Al_{0.85}Ga_{0.15}As_{0.56}Sb_{0.44}$). The second grading layer 120b may have a thickness between 50 and 100 nm. Such a thickness is particularly suited for high speed operation. Other thicknesses may be employed (e.g. thicker for lower speed operation) in alternative embodiments. Indeed, for the avoidance of doubt, all thicknesses referred to in the present specification are non-limiting and alternative embodiments may employ layers of different thicknesses.

The second field control layer 118b may comprise p-doped $Al_xGa_{1-x}As_ySb_{1-y}$, where x is between 0.4 and 1.0 inclusive, and optionally to between 0.85 and 1 inclusive. In certain embodiments, y may be chosen to lattice match the alloy to InP. In certain embodiments, y may be 0.56 when x is 0.85 to ensure lattice matching to InP (e.g. $Al_{0.85}Ga_{0.15}As_{0.56}Sb_{0.44}$). The second field control layer 118b may have a thickness between 50 and 100 nm.

The SAMAPD structure 110 may additionally comprise a first contact layer 112 and a second contact layer 124 disposed on opposing sides of the SAMAPD structure 110. The first contact layer 112 may comprise heavily doped N⁺ InGaAs. The first contact layer 112 may have a thickness between 10 and 1000 nm. The second contact layer 124 may comprise heavily doped P⁺⁺ InGaAs and/or may have a thickness of between 50 and 100 nm.

The SAMAPD structure 110 may additionally comprise a cladding layer 114 between the first contact layer 112 and the avalanche layer 116. The cladding layer 114 may comprise AlGaAsSb which may be heavily N⁺ doped. For example, the cladding layer 114 may comprise $Al_xGa_{1-x}As_ySb_{1-y}$, where x is between 0.4 and 1.0 inclusive, and optionally to between 0.85 and 1 inclusive. In certain embodiments, y may be chosen to lattice match the alloy to InP. In certain embodiments, y may be 0.56 when x is 0.85 to ensure lattice matching to InP (e.g. $Al_{0.85}Ga_{0.15}As_{0.56}Sb_{0.44}$). The cladding layer 114 may have a thickness between 100 and 300 nm.

Between the second contact layer 124 and the absorption layer 122, there may be provided a barrier layer 128 adjacent the second contact layer 124 and a third grading layer 120c disposed between the barrier layer 128 and the absorption layer 122. The barrier layer 128 may comprise highly doped P+ InAlAs and/or may have a thickness between 100 and 300 nm. The third grading layer 120c may comprise InAlGaAs and may be graded as described above in relation to the first and/or second grading layers 120a, 120b. The third grading layer 120c may comprise very lightly p-doped InAlGaAs with step or continuous bandgap grading between InGaAs and InAlAs. The third grading layer 120c may comprise 2 to 3 layers of 20 to 50 nm thickness (if stepped) or a single layer having a thickness of about 100 nm (if continuously graded).

If the electric field in the multiplication layer 116 is required to be above 600 kV/cm, then the transition layer 126, the second grading layer 120b and the second field control layer 118b may be required to minimize impact ionization in the first field control layer 118a. In alternative embodiments (e.g. that of FIG. 4B), any or all of the transition layer 126, second grading layer 120b and second field control layer 118b may not be required (as shown in FIG. 4B, for example).

The electric field in the absorption layer 122 may be kept at or below 150 kV/cm. The first field control layer 118a may allow the electric field to increase to a suitable value (e.g. up to 600 kV/cm) to ensure electrons predominantly populate the X valleys, while minimizing tunnelling current. The second grading layer 120b then allows smooth transport of electrons into the AlGaAsSb. The second field control layer 118b allows electric field to increase to above 600 kV/cm in the avalanche layer 116, while minimizing tunnelling current and impact ionization in the InAlAs field control layer. The value of the electric field required to achieve a certain gain will be determined by the thickness and composition of the $Al_xGa_{1-x}As_ySb_{1-y}$ avalanche layer 116.

In an alternative embodiment of the invention (shown schematically in FIG. 6A), there is provided an SAMAPD structure 210, comprising an absorption layer 222 comprising GaAsSb, an avalanche layer 216 comprising AlGaAsSb, and a transition portion 219 disposed between the absorption layer 222 and the avalanche layer 216. The transition portion 219 comprises a first grading layer 220a and a first field control layer 218a disposed between the first grading layer 220a and the avalanche layer 216. The first field control layer 218a has a bandgap between the bandgap of the absorption layer 122 and the bandgap of the avalanche layer 116. The first grading layer 220a is graded so that x increases from x=0 to x>0 along a direction from the absorption layer 222 to the first field control layer 218a. Further (non-limiting) example structures 210 having these features are shown schematically in FIGS. 6B and 7A. The band structure corresponding to the structure 210 of FIG. 7A is shown in FIG. 7B (with an electron 230 and a hole 232 of a photo-generated electron-hole pair shown for completeness). FIG. 7C shows the modulus of the electric field within the structure 210 of FIG. 7A.

In certain embodiments, the avalanche layer 216 may comprise $Al_xGa_{1-x}As_ySb_{1-y}$, where x is between 0.4 and 1.0 inclusive and optionally between 0.85 and 1.0 inclusive. In certain embodiments, y may be chosen to lattice match the alloy to InP. In certain embodiments, y may be 0.56 when x is 0.85 to ensure lattice matching to InP (e.g. $Al_{0.85}Ga_{0.15}As_{0.56}Sb_{0.44}$). The avalanche layer 216 may have a thickness between 50 and 1500 nm depending on the noise performance and speed performance required by a given application.

In certain embodiments, the absorption layer 222 may be intrinsic, but could be lightly doped (n or p type). The absorption layer 222 may have a thickness between 100 and 3000 nm, and optionally between 500 and 1500 nm depending on the quantum efficiency required.

The first grading layer 220a may have a constant bandgap across its thickness. In alternative embodiments, the first grading layer 220a may be graded so as to have an increasing bandgap along the direction from the absorption layer 222 to the avalanche layer 216. In certain embodiments, the grading of the first grading layer 220a may be continuous (e.g. across a thickness of 100 nm) or stepped. For example, a stepped grading may be achieved by a plurality of layers, where each layer has a different bandgap relative to adjacent layers. In certain embodiments, 2 or 3 "step" layers may be provided, where, optionally, each layer may have a thickness of 20 to 50 nm.

Figure 6A:
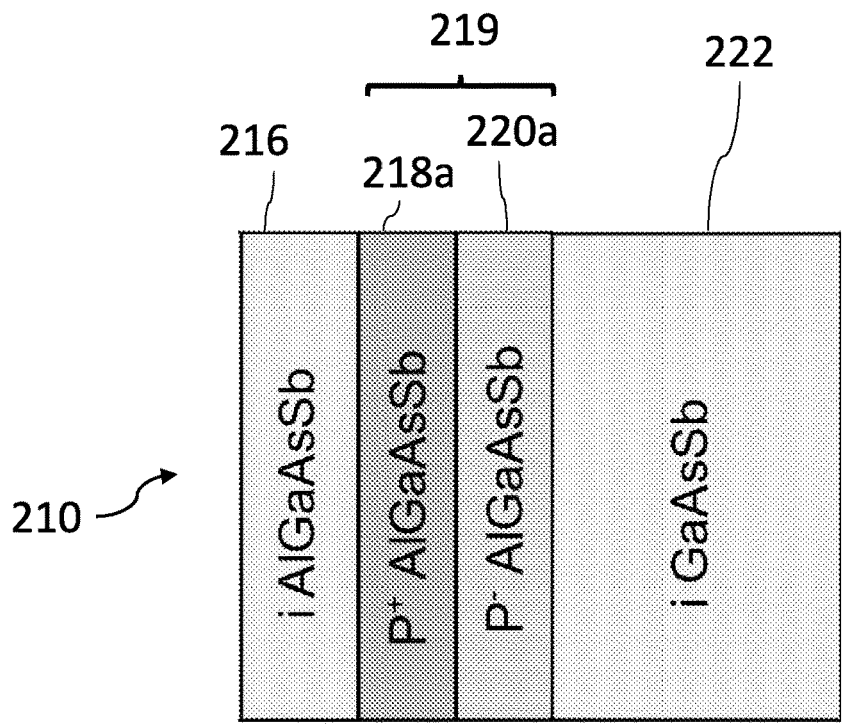
FIG. 6A is a schematic diagram of a GaAsSb/AlGaAsSb SAMAPD in accordance with an embodiment of the present invention.
Figure 6B:
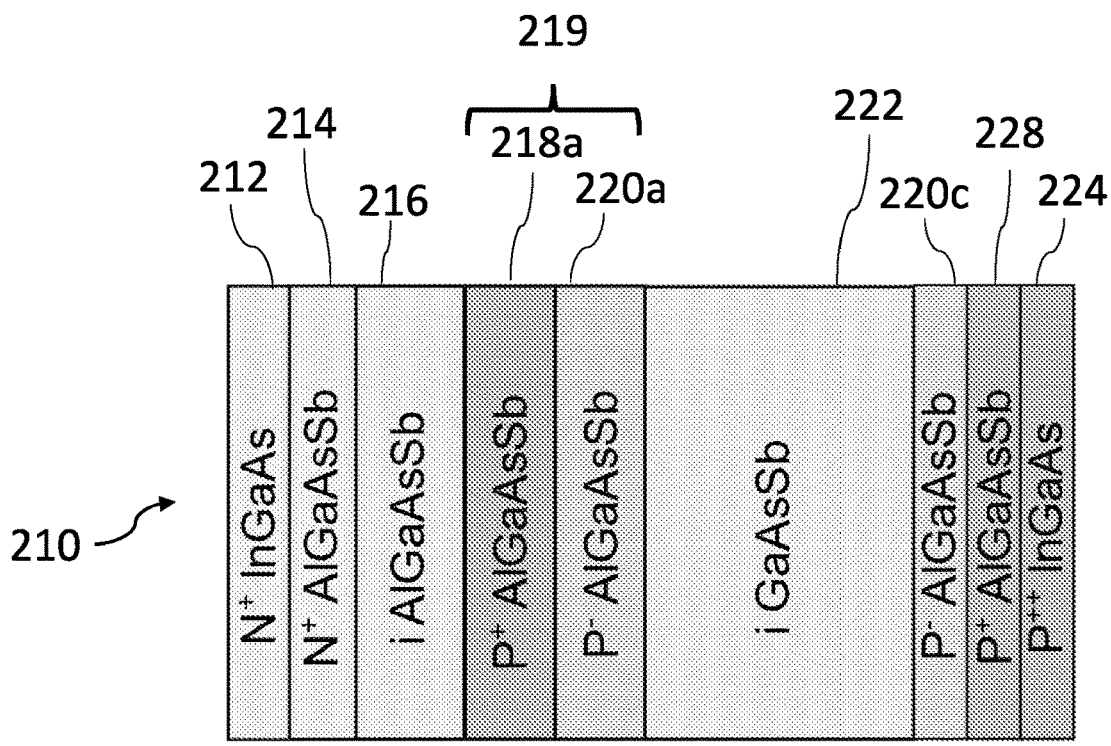
FIG. 6B is a schematic diagram of a GaAsSb/AlGaAsSb SAMAPD in accordance with an embodiment of the present invention.

In the embodiments shown in FIGS. 6A, 6B and 7A, the SAMAPD structure 210 has a first field control layer 218a between the first grading layer 220a and the avalanche layer 216. The first field control layer 218a may be adjacent to the first grading layer 220a. The first field control layer 218a may comprise p-doped AlGaAsSb. The AlGaAsSb may allow an electric field in $Al_xGa_{1-x}As_ySb_{1-y}$ (x=0.4 to 1 and y is chosen to lattice match the alloy to InP) to be up to 600 kV/cm. The first field control layer 218a may have a thickness between 50 and 100 nm.

If the electric field in the multiplication layer 216 is required to be above 600 kV/cm, then a transition layer 226, a second grading layer 220b and second field control layer 218b may be required to minimize impact ionization in the first field control layer 218a (e.g. as shown in FIG. 7A). The intrinsic layer 226 may be provided adjacent to the first field control layer 218a. The intrinsic layer 226 may comprise intrinsic AlGaAsSb. The intrinsic layer 226 may have a thickness between 50 and 200 nm.

The second grading layer 220b may be provided between the intrinsic layer 226 and the avalanche layer 216. The second grading layer 220b may be provided adjacent to the intrinsic layer 226. The second grading layer 220b may comprise $P^-$ AlGaAsSb. The second grading layer 220b may be graded in the same manner as described above in relation to the first grading layer 220a.

The second field control layer 218b may be provided between the intrinsic layer 226 and the avalanche layer 216. In the embodiment shown in FIG. 7A, the second field control layer 218b is provided adjacent to and between the second grading layer 220b and the avalanche layer 216. The second field control layer 218b may comprise p-doped AlGaAsSb. In certain embodiments, the second field control layer 218b may comprise p-doped $Al_xGa_{1-x}As_ySb_{1-y}$ (where x is between 0.4 and 1, and optionally between 0.85 and 1, and y is chosen to lattice match the alloy to InP).

The SAMAPD structure 210 may additionally comprise a first contact layer 212 and a second contact layer 224 disposed on opposing sides of the SAMAPD structure 210. The first contact layer 212 may comprise heavily doped $N^+$ InGaAs. The first contact layer 212 may have a thickness between 10 and 1000 nm. The second contact layer 224 may comprise heavily doped $P^{++}$ InGaAs and/or may have a thickness of between 50 and 100 nm.

The SAMAPD structure 210 may additionally comprise a cladding layer 214 between the first contact layer 212 and the avalanche layer 216. The cladding layer 214 may comprise $Al_xGa_{1-x}As_ySb_{1-y}$ (where x is between 0.4 and 1, and optionally between 0.85 and 1, and y is chosen to lattice match the alloy to InP) which may be heavily $N^+$ doped. The cladding layer 214 may have a thickness between 100 and 300 nm.

Between the second contact layer 224 and the absorption layer 222, there may be provided a blocking layer 228 adjacent the second contact layer 224 and a third grading layer 220c disposed between the blocking layer 228 and the absorption layer 222. The blocking layer 228 may comprise highly doped $P^+$ AlGaAsSb (i.e. $Al_xGaAsSb$, where x is between 0 and 1) and/or may have a thickness between 100 and 300 nm. The third grading layer 220c may comprise AlGaAsSb and may be graded as described above in relation to the first and/or second grading layers 220a, 220b. The third grading layer 220c may comprise very lightly p-doped AlGaAsSb with step or continuous bandgap grading between $GaAs_{0.56}Sb_{0.44}$ and $Al_xGa_{1-x}As_ySb_{1-y}$ (where x is between 0.4 and the x value chosen for layer 228, and optionally between 0.85 and 1, and y is chosen to lattice match the alloy to InP). The third grading layer 220c may comprise 2 to 3 layers of 20 to 50 nm thickness (if stepped) or a single layer having a thickness of about 100 nm (if continuously graded).

With regard to the structure 210 shown in FIG. 7A, the electric field in the absorption layer 222 may be kept at below 150 kV/cm. The first field control layer 218a allows the electric field to increase to a suitable value (e.g. up to 600 kV/cm) to ensure electrons are predominantly in X valleys. The second field control layer 218b allows the electric field to increase to above 600 kV/cm (final value is dependent on the value of x in $Al_xGa_{1-x}AsSb$) in the avalanche layer 216. The use of GaAsSb as the absorption layer 222 provides the additional benefit of simplifying the growth procedures of the structure 210, since growth may be achieved by the switching of the Ga and Al sources.

The use of GaAsSb as the absorption layer 222 also provides an additional advantage of lower band-to-band tunneling current because of the larger effective mass of $0.055m_o$, which is larger than $0.04m_o$ in InGaAs. Additionally, since no indium is required in this embodiment (in contrast to embodiments including indium), the switch from GaAsSb to AlGaAsSb during growth of the structure 210 is, advantageously, comparably simpler.

Finally, the AlGaAsSb "step" provided by the transition portion 219 can tolerate higher electric field without significant impact ionization.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An avalanche photodiode (APD) structure, comprising:
   an absorption layer comprising InGaAs, InGaAlAs, InGaAsP, or an InGaAs/GaAsSb type-II superlattice;
   an avalanche layer comprising AlGaAsSb; and
   a transition portion disposed between the absorption layer and the avalanche layer;
   wherein the transition portion comprises a first grading layer of InAlGaAs or InGaAsP and a first field control layer disposed between the first grading layer and the avalanche layer; and
   wherein the first field control layer has a bandgap between the bandgap of the absorption layer and the bandgap of the avalanche layer.

2. The APD structure of claim 1, wherein the first field control layer is p-doped.

3. The APD structure of claim 2, wherein the first field control layer is p-doped at a concentration between $1\times10^{17}$ cm$^{-3}$ and $1\times10^{18}$ cm$^{-3}$, and optionally between $1\times10^{17}$ cm$^{-3}$ and $5\times10^{17}$ cm$^{-3}$.

4. The APD structure of claim 1, wherein the first field control layer has a thickness between 40 nm and 300 nm.

5. The APD structure of claim 1, wherein the first grading layer is graded so as to have an increasing bandgap along the direction from the absorption layer to the avalanche layer.

6. The APD structure of claim 5, wherein the bandgap of the first grading layer increases from that of the absorption layer to that of InAlAs.

7. The APD structure of claim 5, wherein the first grading layer comprises discrete layers of differing bandgaps or a layer having a continuously increasing bandgap.

8. The APD structure of claim 1, comprising a second grading layer of AlGaAsSb disposed between the first field control layer and the avalanche layer.

9. The APD structure of claim 8, wherein the bandgap of the second grading layer increases to that of the avalanche layer.

10. The APD structure of claim 9, wherein the bandgap of the second grading layer increases from that of InAlAs to that of the avalanche layer.

11. The APD structure of any of claim 8, comprising a second field control layer disposed between the second grading layer and the avalanche layer.

12. The APD structure of claim 11, wherein the second field control layer comprises AlGaAsSb.

13. The APD structure of claim 11, wherein the second field control layer is p-doped.

14. The APD structure of claim 1, wherein the avalanche layer comprises Al$_x$Ga$_{1-x}$As$_y$Sb$_{1-y}$ where x is between 0.4 and 1, and optionally between 0.85 and 1, and y is chosen to lattice match Al$_x$Ga$_{1-x}$As$_y$Sb$_{1-y}$ to InP.

15. The APD structure of claim 1, wherein the absorption layer has a thickness between 500 and 1500 nm, and optionally between 1000 and 1500 nm.

16. The APD structure of claim 1, wherein the avalanche layer has a thickness between 50 and 2000 nm, and optionally between 50 and 1500 nm.

17. The APD structure of claim 1, wherein the first field control layer comprises a material that is lattice-matched to InP.

18. The APD structure of claim 1, wherein the first field control layer comprises InAlAs or InP.

19. The APD structure of claim 1, wherein the first field control layer has a bandgap of 1 eV or greater.

20. An avalanche photodiode (APD) structure, comprising:
    an absorption layer comprising GaAsSb;
    an avalanche layer comprising AlGaAsSb; and
    a transition portion disposed between the absorption layer and the avalanche layer;
    wherein the transition portion comprises a first grading layer and one or more field control layers disposed between the absorption layer and the avalanche layer, wherein the first grading layer comprises Al$_x$Ga$_{1-x}$AsSb that is graded so that x increases from x=0 to x>0 along a direction from the absorption layer to the avalanche layer, and the one or more field control layers that has a bandgap between the bandgap of the absorption layer and the bandgap of the avalanche layer.

21. The APD structure of claim 20, wherein the avalanche layer comprises Al$_x$Ga$_{1-x}$As$_y$Sb$_{1-y}$ where x is between 0.4 and 1, and optionally between 0.85 and 1, and y is chosen to lattice match Al$_x$Ga$_{1-x}$As$_y$Sb$_{1-y}$ to InP.

22. The APD structure of claim 20, wherein the first grading layer comprises Al$_x$Ga$_{1-x}$As$_y$Sb$_{1-y}$ that is graded so that x increases from 0 to between 0.4 and 1.0 inclusive, and optionally to between 0.85 and 1 inclusive, and y is chosen to lattice match Al$_x$Ga$_{1-x}$As$_y$Sb$_{1-y}$ to InP.

23. The APD structure of claim 22, wherein the first grading layer comprises discrete layers of differing bandgaps or a layer having a continuously increasing bandgap.

24. The APD structure of claim 20, wherein the absorption layer has a thickness between 500 and 1500 nm, and optionally between 1000 and 1500 nm.

25. The APD structure of claim 20, wherein the avalanche layer has a thickness between 50 and 2000 nm, and optionally between 50 and 1500 nm.

26. The APD structure claim 20, wherein the one or more field control layers comprise one or more layers of AlGaAsSb.

27. The APD structure of claim 26, wherein the one or more layers of AlGaAsSb is p-doped.

* * * * *